United States Patent [19]

Münz et al.

[11] E Patent Number: Re. 33,530

[45] Reissued Date of Patent: Feb. 5, 1991

[54] PROCESS AND APPARATUS FOR THE COATING OF SHAPED ARTICLES BY CATHODE SPUTTERING

[75] Inventors: Wolf-Dieter Münz, Somborn; Gerhard Hessberger, Karlstein, both of Fed. Rep. of Germany

[73] Assignee: Leybold Aktiengesellschaft, Hanau, Fed. Rep. of Germany

[21] Appl. No.: 819,544

[22] Filed: Jan. 16, 1986

Related U.S. Patent Documents

Reissue of:

[64] Patent No.: 4,426,267
Issued: Jan. 17, 1984
Appl. No.: 351,730
Filed: Feb. 24, 1982

[30] Foreign Application Priority Data

Mar. 2, 1981 [DE] Fed. Rep. of Germany ..... 3107914

[51] Int. Cl.[5] ..... C23C 14/34

[52] U.S. Cl. ..... 204/192.12; 204/298.06; 204/298.16

[58] Field of Search ..... 204/192 R, 192 L, 298, 204/192.12, 298.06, 298.16

[56] References Cited

U.S. PATENT DOCUMENTS

| | | | |
|---|---|---|---|
| 4,308,126 | 12/1981 | Wright | 204/298 |
| 4,354,910 | 10/1982 | Rordorf | 204/192 R |
| 4,426,267 | 1/1984 | Münz | 204/192 R |
| 4,544,468 | 10/1985 | Münz et al. | 204/298 |

OTHER PUBLICATIONS

Maniv et al., J. Vac. Sci. Technol., 17 (1980), pp. 743–751.

*Primary Examiner*—Nam X. Nguyen
*Attorney, Agent, or Firm*—Felfe & Lynch

[57] ABSTRACT

The invention concerns a method of coating shaped parts having a three-dimensional coating surface by the cathodic atomization of target material of a first cathode arrangement. The cathode arrangement comprises a magnetic field generator for the concentration of a first discharge space (plasma cloud) in the zone of the target surface by means of a first magnetic field (plasma trap), which is spatially closed with respect to the target. According to the invention and for the purpose of producing a uniform coating even on parts of complicated shape, it is proposed that, on their side disposed opposite the first cathode arrangement, the shaped parts should be simultaneously subjected to the atomizing action of a second cathode arrangement with the same target material. The second cathode arrangement likewise comprises a magnetic field generator for concentrating a second discharge space in the zone of the target surface by means of a second magnetic field, spatially closed with respect to the target; the second cathode arrangement is so arranged in relation to the first that the two cathode arrangements between them form a gap in which discharge occurs and through which the shaped parts are moved. Furthermore, a voltage $U_{Sub}$, which is negative with respect to ground and is of such magnitude that the discharge spaces of the two cathode arrangements reach and touch the shaped part, is applied to said part.

The invention also covers apparatus for performing the method of the invention.

13 Claims, 6 Drawing Sheets

PROCESS AND APPARATUS FOR THE COATING OF SHAPED ARTICLES BY CATHODE SPUTTERING

Figure 1:
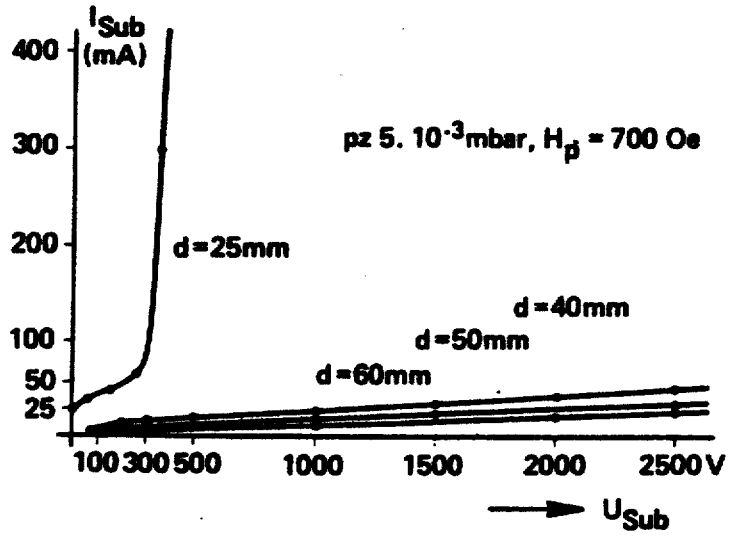

Matter enclosed in heavy brackets [ ] appears in the original patent but forms no part of this reissue specification; matter printed in italics indicates the additions made by reissue.

The invention concerns a method and apparatus for coating a three-dimensional surface by cathodic atomization of target material.

An analogous coating method for substrates with two-dimensional coating surfaces is known from, for example, DE-OS No. 22 43 708. With the known method and apparatus, because of the preferential direction of travel of the atomized particles, coating shaped, three-dimensional parts is either not possible or possible to a limited extent only if the shaped parts are rotated relative to the atomizing arrangement. However, even with rotation it is possible to coat substantially only the surface or revolution of the rotation parts and the end faces do not acquire an adequate deposit of the coating material. If this is also required, use must be made of work holders which permit complicated compound movements about three different axes. The drive means for such holders are complicated. Also the apparatus has a very low capacity because the parts are coated mainly from only one direction, so that the coating operation is lengthy. Furthermore, fitting the parts in holders of this kind is a troublesome matter because of the need for securing them for the rotation. The use of such holders thus is usually out of the question for continuously operating installations.

In comparison with what is known as the vacuum deposition process wherein vaporized particles move along a straight line from the vapour source to the substrate, which circumstance leads to extreme variations in the thicknesses and compositions of the coatings on shaped parts, the cathode atomization method, in the same way as the ion cladding method, possesses a certain advantage. This stems from the fact that the said methods, in contrast to the vacuum deposition process, are carried out in a pressure range of from $5\times10^{-3}$ to $5\times10^{-2}$ mbars. This means that the mean free path of the ions and atoms involved in the processes lies in the range of 5 to 10 mm, so that, in typical apparatus, the individual particles collide with each other several times during passage from the source to the substrate. As a result of this, disordered movement of ions and atoms occurs which, to a certain extent, allows "round the corner" coating to take place.

For coating all the faces of shaped parts, what is called the CVD (chemical vapor deposition) process might be considered advantageous, this process having been applied in numerous cases over a wide field; however, the process is not successful for the coating of temperature-sensitive parts, since the various CVD processes all call for substrate temperatures of 900° to 1100° C. These temperatures cannot be used for high-speed tool steels, for example, the maximum temperature load being on the order of 600° C. The above-mentioned temperatures are also totally unsuitable for coating, for example, watch-cases or watch-straps requiring a reproducible gold-like surface or having a spring which cannot withstand so great a heat load.

In contrast to this, the substrate temperature in vacuum coating is lower. As regards ion cladding, the high accelerating voltage of 3000 to 5000 volts at the substrate and the ion bombardment associated therewith, produce substrate temperatures between 250° and 500° C., so that the growth of crystalline hard coatings, such as titanium nitride coatings, is promoted. In the case of cathodic atomization, heating is caused mainly by secondary electron bombardment. The temperatures that occur lie in the range of from 50° to 300° C. and are often even too low to enable the required hardnesses of coating to be achieved.

A cathodic atomization method which is also often referred to as high-duty cathodic atomization or magnetron sputtering, provides ideal pre-conditions for coating on a continuous basis, because of the discharge geometry. Thus, coating installations having a high productivity are possible. The special feature in high-duty atomization is a magnetic plasma trap which substantially confines a plasma cloud from the cathodic-atomization discharge to a zone at the target surface, so that particularly pronounced removal of the target material occurs in that zone. This leads to a substantially greater atomization and deposition rate. Since details of this method have been comprehensively described in the literature, it is not necessary to deal with them herein.

Further aspects favoring the cathodic atomization method are that it is possible to provide cathodes having a length of several meters, and that a particularly highly developed system for operating and controlling the process is now available. The possibility of using substrate temperatures of below 250° C. widens the field of application, e.g. to include plastics material, assembled watch-straps incorporating temperature-sensitive spring elements, temperature-sensitive cast materials, etc. Furthermore, cathodic atomization permits problem-free coating with metal alloys and metal compounds of, for example, titanium and zirconium.

Whereas, in conventional cathodic atomization without magnetic field support, the target load is approximately 5 watt/cm$^2$ maximum, it can be raised to 25 watt/cm$^2$ in the initially described atomization process. The atomization or deposition rates that can be achieved are proportional to the power supplied to the target. The high load-carrier densities resulting from this process lead to a reduction in the discharge voltage to 200 to 600 volts, and taken as a whole, this leads to greater target loadability.

Because of the effect of the magnetic field and the concentration of the plasma in front of the target, the substrate carrier does not perform the otherwise usual anodic function. In high-duty atomization, the electrons flow to the container or to interior components of the atomization installation, whereas the substrates remain relatively cool. In high-duty atomization, substrate temperatures of between 50° to 300° C., depending upon the volume and the thermal conductivity of the substrates, occur.

High-duty atomization can also be used for the reactive atomization of metallic targets. Since the details of this method have likewise long formed part of the prior art, there is no need to describe the various possible reactions with the many different reaction gases. Many practical proposals for operating and regulating the reactive atomization processes have also been put forward in the past, so that coatings of, for example, oxides, nitrides or carbides, having reproducible properties can be obtained.

The high-duty atomization process has hitherto been used mainly for coating planar substrates, and applications have ranged from the coating of silicon wafers and ceramic substrates in the micro-electronics field to glass substrates for LCD displays or sheets of up to several square meters. In this method, the coating rate diminishes as the target distance increases. This means that the thickness of the deposited coating cannot be the same at all points on a shaped part. Furthermore, masking which occurs at least to some extent and is caused by the geometry of the shaped part, is superposed upon this effect. If the atomization process is a reactive one, the differing coating rates also result in differing compositions of the deposit, depending upon the distance from the target. The reason for this is that the partial pressure of the reactive gas is substantially constant over the entire discharge space, whereas the stoichiometric ratios of the deposit depend upon the relationship between the probability of impingement of the metal particles and that of the reactive gas particles. Consequently, the hardness of the coating on the side presented to the target differs from that on the rear side or in the case of decorative coatings, for example, the gold colour of a watch-case is not identical on the front and rear sides. Furthermore, as the result of a biasing potential $U_{Sub}$ of the substrate, the effect of the ion bombardment is likewise dependent upon distance and this leads to different temperatures and a different "self-cleaining effect", as it is called.

The object of the present invention is, therefore, to improve a method of the initially described kind in such a way that even shaped parts of complicated geometry, acquire a more-uniform coating as regards the most important properties, which include the chemical and mechanical condition, hardness, appearance, thickness and chemical composition of the coating.

According to the invention, this object is achieved in that the shaped part or parts is or are simultaneously subjected, to the atomizing action of first and second facing cathode arrangements with the same target material and with the concentration from magnetic fields respectively spatially closed with respect to the targets, and in that a voltage $U_{Sub}$, negative with respect to ground, is applied to the shaped part and is of such magnitude that the plasma clouds of the two cathode arrangements at least touch each other at the shaped part.

The invention consists not only in the provision of a mirror symmetrical arrangement of two discharge processes at two sides of the shaped part or parts; in addition, the application of a negative voltage $U_{Sub}$ to the shaped parts plays an important role. This may be observed very closely through a window provided in the apparatus. Initially, two discharges or plasma clouds light up in the discharge space between two cathode arrangements, each of the known kind having magnetic field generators (high-duty cathode or magnetrons). These discharges are separated from each other by a dark space and are limited to the zone immediately in front of the two target surfaces. A substrate or shaped part is not present initially. When it is moved into the discharge space between the targets and a suitably selected voltage, negative with respect to earth, is applied, the plasma clouds undergo a series of sudden increases in size until they surround the substrate or shaped part on all sides. In the case of several smaller shaped parts, the plasma clouds move one into the other or interpenetrate, so that the spaces between the parts are filled by the plasma-cloud glow discharge. During this process, the brightness of the plasma-cloud discharge also increases sharply.

A reverse procedure can also be used, the shaped parts initially being introduced into the space between the targets without an electrical connection and without the application of ground potential. Initially, the plasma-cloud glow discharges do not change noticeably. If a negative voltage is then applied to the shaped part and is continuously increased, the plasma clouds generally increase in size in the direction of the shaped part until they reach and swirl around it. In this way, it is readily possible to determine that negative voltage $U_{Sub}$ at which the plasma-clouds of the two cathode arrangements reach and touch the shaped part. As a guide, it should be stated that the greater the distance between the two plasma-clouds (without the shaped part) and the "thinner" the shaped part, the higher must be this voltage.

In this way and because of the negative biasing potential of the shaped part, mutual advance and penetration or the two plasma discharges, accompanied by condensation of the coating material on all sides, occurs since, in the case of reactive atomization coating processes, the stoichiometry of the condensate is also ensured substantially all over the substrate surface, an extremely uniform coating composition is obtained. Very great uniformity is obtained also as regards the thickness of the coating, i.e. no appreciable masking effects could be observed. Furthermore, the hardness distribution, and in the case of decorative coatings, the appearance of the surface were particularly uniform over the entire periphery of the shaped part. Despite the great hardness of the coating, the shaped parts could be kept at a lower temperature level, so that, for example, watch-cases and watch-straps having incorporated spring elements could be coated in a perfect manner. In addition, excellent adherence of the coatings applied by atomization was achieved.

In a further advantageous form of the invention, the parameters of the method such as atomization capacity per unit of area of the target, distance between targets, and strength of magentic field are so selected that the plasma-clouds of the two target surfaces overlap at least partially even when no shaped part or parts is or are present, and the voltage $U_{Sub}$, applied to the shaped part, is at least 10 volts (negative) with respect to earth. The trend or influencing factors of the various parameters of the method with be dealt with more fully hereinafter in the detailed description. At the present stage it will merely be stated that the strength of the magnetic field is reduced as compared with the strength normally employed in high-duty atomization, so that the normal marked restriction on the discharge is to some extent dispensed with. Consequently, a relatively low voltage $U_{Sub}$ is sufficient for increasing or modifying the effect of the discharge on the shaped part.

The method in accordance with the invention is particularly suitable for the production of coatings of titanium nitride (TiN). In this connection and in accordance with a further feature of the invention, the atomization atmosphere contains, in addition to an inert gas (argon), nitrogen having a partial pressure of between $4\times10^{-4}$ and $8\times10^{-4}$ means at a total pressure of $5\times10^{-3}$ and $2\times10^{-2}$ mbars.

The titanium nitride coating of shaped parts for various purposes has been the subject of investigations for several years. At the forefront of developments has been, in particular, possible use of the technique in the coating of tools, such as drills, millers and reversible flat cutting plates, with noblar metals. In recent times, a new field of application has opened up, namely the use of titanium nitride as a substitute for gold, e.g. for the coating of watch-cases, watch-straps and other commodity articles. Here, a particularly important role is played by the reduction of material costs and problems relating to the disposal of effluents such as are typical of the existing galvanizing processes. The hardness of coating, which is considerably greater than that of gold, constitutes a further advantage. Process control of the method of the invention is considerably better developed than in the conventional method. This is particularly important as regards reproducibility in the production of the above described gold-colored coatings.

Further advantageous forms of the method of the invention as well as apparatus in accordance with the invention [will be set forth in the appended claims and explained in detail in the following description.] *are:*

*Discharge volume: $U_e$=2000 to 1000 v,*

*Substrate volume: $U_{Sub}$=−50 to −500 v,*

*Atomization power N=5 to 30 watt/cm², and preferably 10 to 15 watt/cm², related to the target surface,*

*Magnetic field=150 to 350 Oersteds, and preferably 200 to 250 Oersteds*

*Target spacing=80 to 200 mm, and preferably 100 to 150 mm, including the thickness "D" of the shaped part,*

*Atomization pressure=$1\times10^{-3}$ to $5\times10^{-2}$ mbars, and preferably $5\times10^{-3}$ to $2\times10^{-2}$ mbars of insert gas (Argon) with Nitrogen at a partial pressure from $4\times10^{-4}$ to $8\times10^{-4}$ mbars*

*Temperatures of −150° to 500° C., and preferably 250° to 300° C.*

Figure 2:
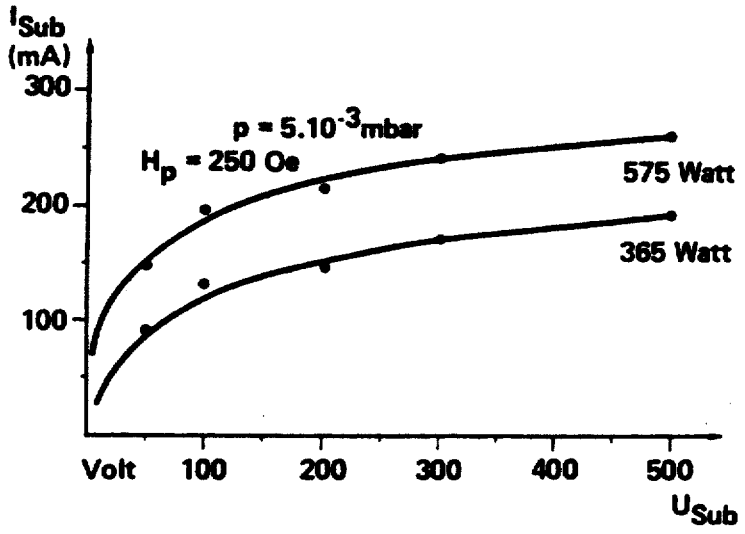
Figure 3:
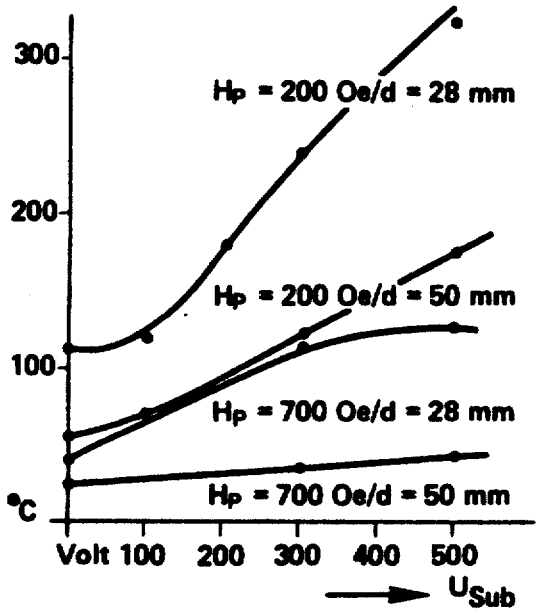
Figure 4:
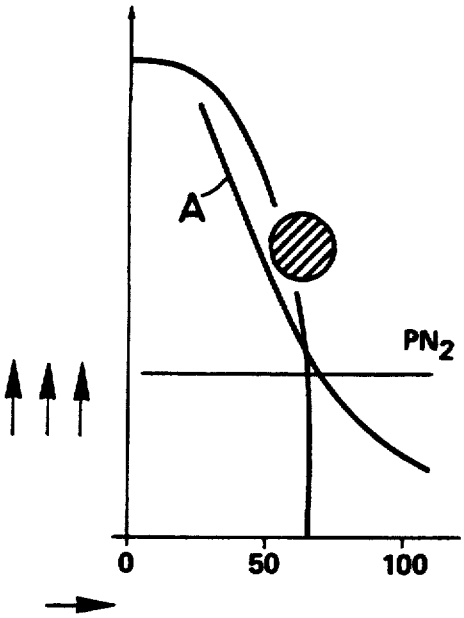
Figure 5:
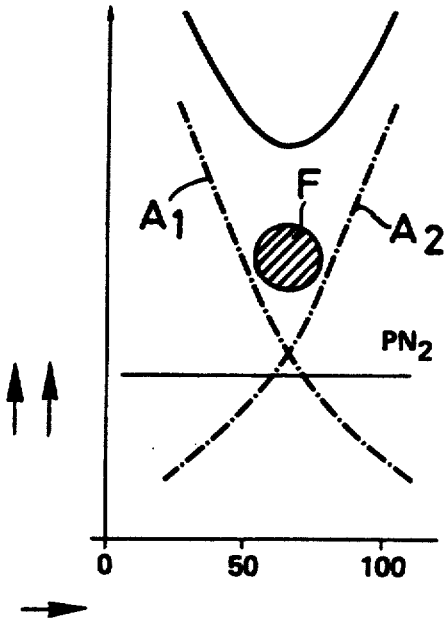
Figure 6:
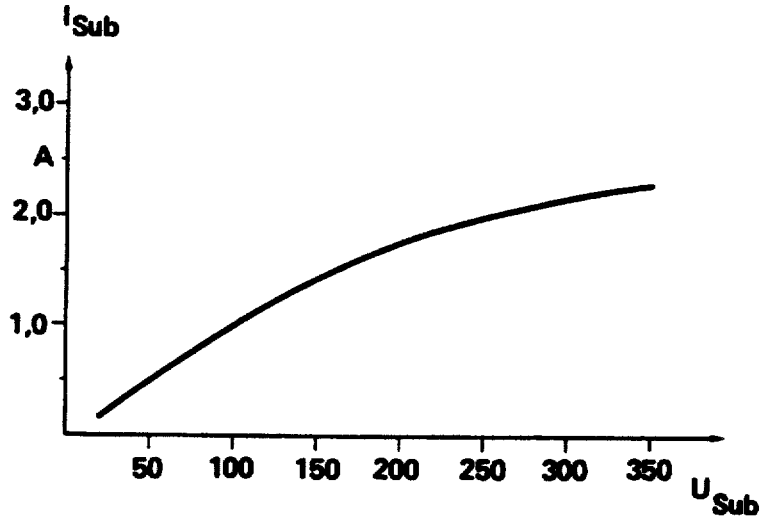
Figure 7:
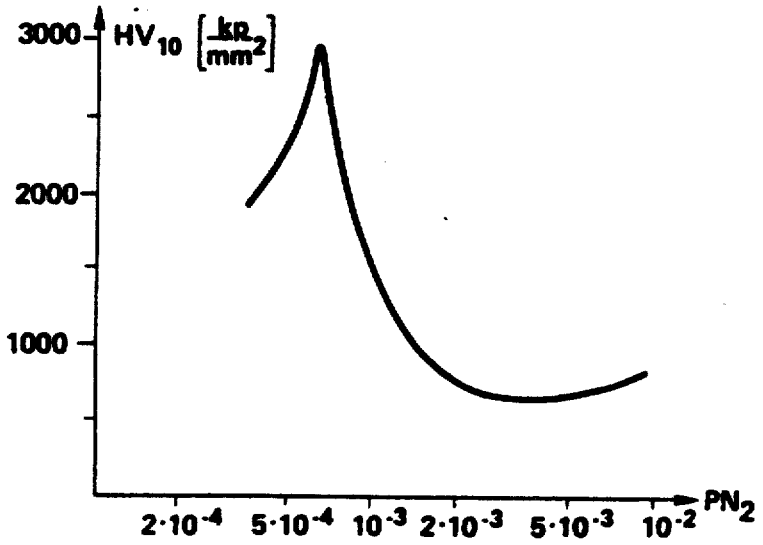
Figure 8:
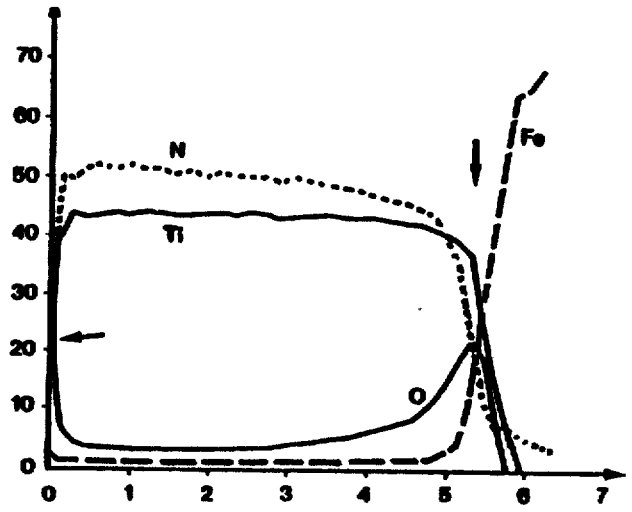
Figure 9:
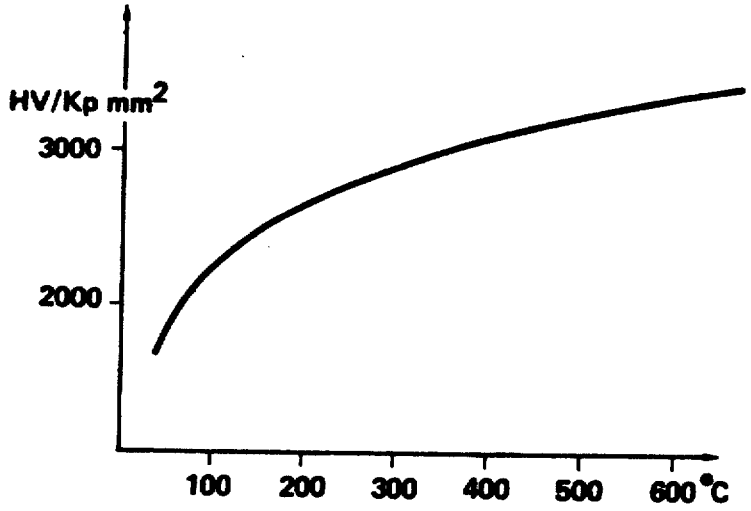
Figure 10:
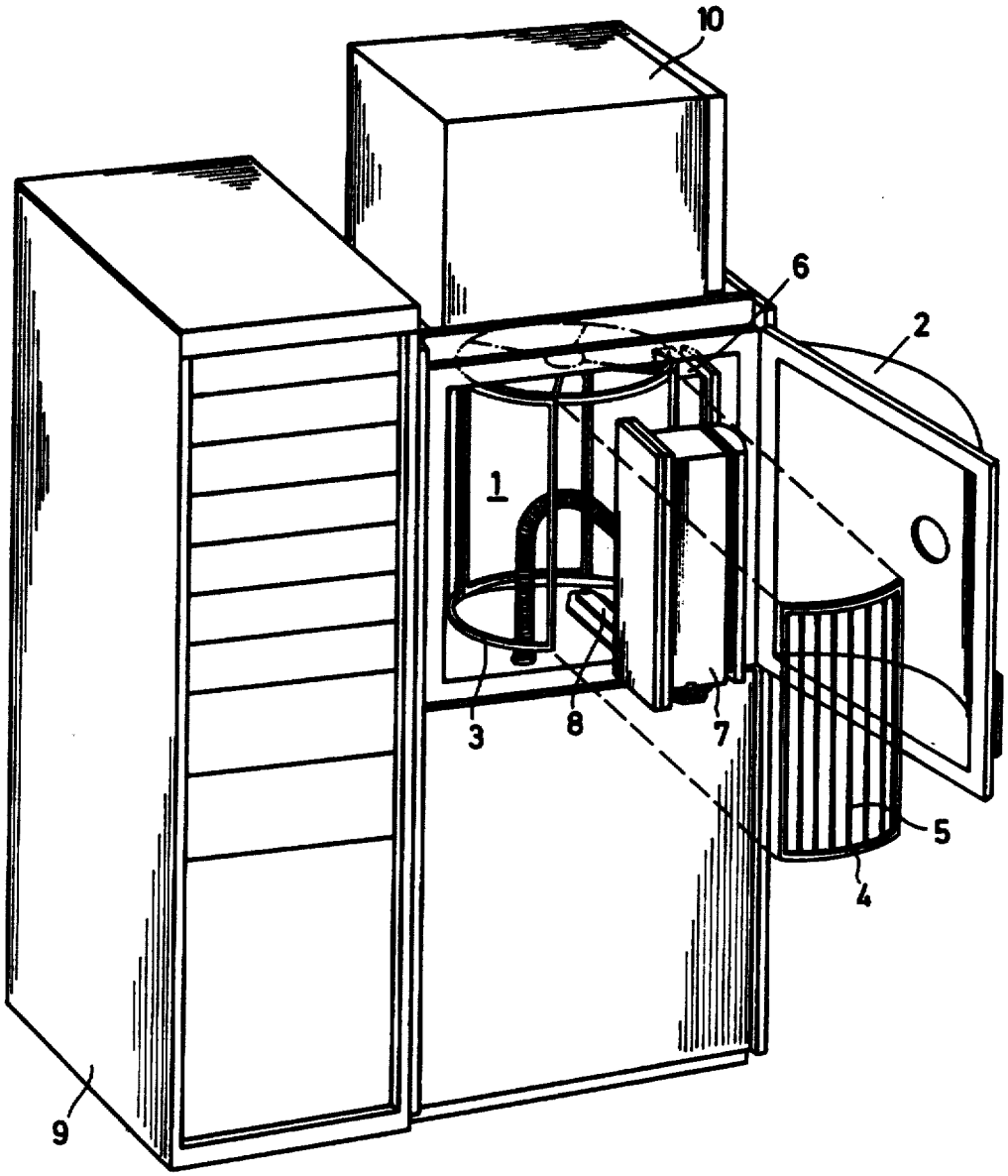
Figure 11:
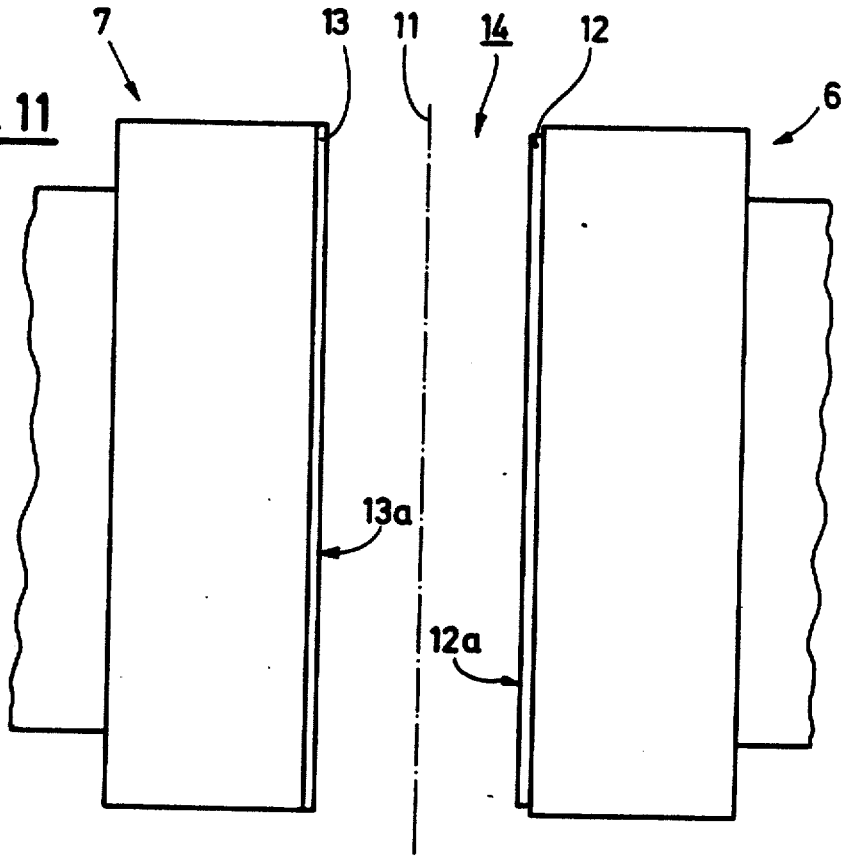
Figure 12:
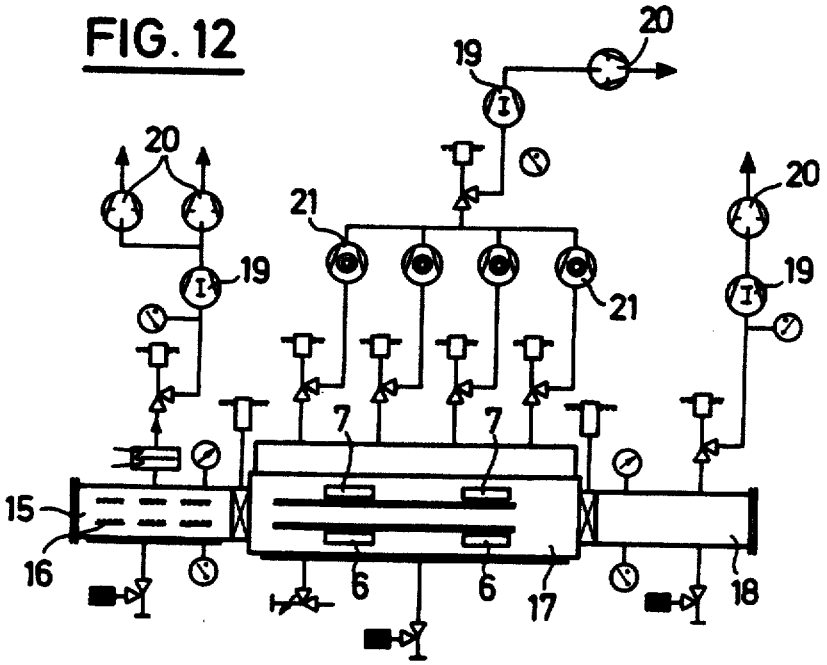

In the drawings:

FIG. 1 shows, in the form of a graph, the substrate current $I_{Sub}$ flowing across the shaped part in relation to the substrate voltage $U_{Sub}$ for various distances "d" between the target and the shaped part, FIG. 2 shows, in the form of a graph, the substrate current $I_{Sub}$ flowing through the shaped part in dependence upon the substrate voltage $U_{Sub}$ for different wattages related to the target, FIG. 3 shows, in the form of a graph, the substrate temperatures, in the state of permanence (self-heating), in dependence upon the substrate voltage, at different distances "d" and magnetic field strengths H, FIG. 4 shows, in the form of a graph, the relationship between various parameters of the atomization process and the distance between target and substrate when a cathode is provided at one side only, FIG. 5 is an illustration similar to that of FIG. 4, but with a cathode arranged at each side, FIG. 6 shows, in the form of a graph, the dependence of the substrate current $I_{Sub}$, flowing through the shaped part, in an arrangement as in FIG. 5, FIG. 7 shows, in the form of a graph, the relationship between the hardness of a TiN coating and the nitrogen partial pressure during atomization coating, FIG. 8 is an "Auger" plot showing the construction of the coating, FIG. 9 shows, in the form of a graph, th relationship between the hardness of a TiN coating and the temperature of the substrate, FIG. 10 is a perspective illustration of apparatus in accordance with the invention and used for batch-wise operations, FIG. 11 shows a cross-section through the cathode arrangement of FIG. 10 on a larger scale and illustrates the built-in cathode arrangement, and FIG. 12 is a diagrammatic illustration of a large installation for continuous operation, in accordance with the invention.

FIG. 1 explains the following relationship: as stated above, in high-duty atomization the plasma is concentrated closely in front of the target by the effect of the magnetic field. In principle, the substrate is electrically insulated from the discharge space; it is not enveloped by the plasma cloud. If a negative biasing potential $U_{Sub}$ of between −100 and −2500 v is applied to a substrate consisting of copper, for example, and having a weight of 200 g, a current $I_{Sub}$, which is less than 50 mA if the distance between the substrate and the target is greater than 40 mm, flows between the vacuum chamber, to which ground potential is applied, and the substrate. The substrate is electrically decoupled. This is the more remarkable since the discharge voltage $U_{Sub}$ in front of the substrate itself is only 350 v. The horizontal component of the magnetic field $H_p$ is 700 H. The discharge pressure is $5\times10^{-3}$ mbars. As shown in the graph, the voltage $U_{Sub}$ can increase very considerably without any appreciable increase in the current $I_{Sub}$ being reached. However, if a certain limiting spacing, which in the present case is 25 mm, is fallen short of, electrical connection between the plasma cloud and the substrate is established, and the substrate current $I_{Sub}$ rises sharply even at a voltage $U_{Sub}$ of −300 volts. Under these conditions, positive ions are extracted from the plasma and are accelerated towards the substrate. Consequently, conditions exist that are similar to those occurring in ion cladding. Depending upon the intensity of the ion bombardment, which can be regulated by the applied substrate voltage, the substrate itself begins to atomize, i.e. the known self-cleaning effect and the increased possibility of coating masked parts of the substrate (rough or structured surface) occur.

FIG. 2 illustrates the following relationship:

The effect described by reference to FIG. 1 does not depend solely upon the distance between the substrate and the target; rather, the spatial boundary of the plasma cloud is also influenced by the power supplied to the target. The greater the target's loading, the wider the plasma will extend. FIG. 2 clearly shows that the substrate current rises with increasing power even if the distance between the target and the substrate remains constant at 20 mm. Two discharge pressure was $5\times10^{-3}$ mbars; the horizontal component of the magnetic field was 250 H, and the area of the substrate was approximately 44 cm².

FIG. 3 explains the following relationship: the strength of the magnetic field plays an important part as the third component. In FIG. 3, the automatic heating up of the substrates that is attainable by ion bombardment is shown in relationship to the substrate voltage $U_{Sub}$ for two different magnetic field strengths of 200 and 700 H as well as for two different distances between substrate and target of 28 and 50 mm. A shaped part made of copper and 200 g in weight was heated up to different extents depending upon the parameters. The coating time was two minutes, the atomizing power was 800 watts and the discharge pressure $5\times10^{-3}$ mbars. It can be clearly seen that the strength of the magnetic field has an affect similar to that of the atomizing power. A high magnetic field strength of 700 H causes the plasma cloud to be constricted, and even when the distance d between the target and the substrate is small, i.e. 28 mm, the substrate temperature exceeds the value 100° C. only slightly. If however, the magnetic field strength $H_p$ is reduced to 200 H, then under these discharge conditions substrate temperatures of up to more than 300° C. are possible as a result of ion bombardment. These facts indicate the trends of the various parameters in the method of the invention.

FIG. 4 additionally illustrates the spatial arrangement of a cylindrical shaped part in relation to the target surface which is imagined as being at the value O on the x-axis. The longitudinal axis of the shaped part is thus located at a distance of approximately 60 mm from the target surface. During movement, which can be imagined as being parallel with the target surface, the shaped part will not be rotated. The rates of deposit by atomization, the charge-carrier density and the partial pressure of the reactive gas (nitrogen) are shown on the y-axis in arbitrary units (wE). As indicated by the curve A in this Figure, the rate of deposit by atomization falls as the distance from the target increases. This results in the disadvantages described above.

FIG. 5 explains the relationships in the case of a paired arrangement of two cathode systems, one on each side of the shaped part F, said systems in fact constituting a mirror-symmetrical arrangement. The target surface on the left is at the value O on the y-axis, and the target surface on the right is imagined as being at the value 120 mm on the x-axis. The relationships explained by reference to FIG. 4 in fact apply as regards each of the cathode arrangements, i.e. the rates of deposit by atomization shown by the dash-dot lines apply in the case of both targets, the curve $A_1$, which moves leftwards at the top, relating to the left-hand target, and the curve $A_2$, which moves rightwards at the top, relating to the right-hand target. However, by superposing the procedures there is created a coating zone in which substantially uniform condensation conditions prevail. The width of the zone of constant condensation and discharge parameters depends upon the various process parameters and is a factor in the optimization of the method and apparatus, the dimensions of the magnetic field of the high-duty cathodes, the target spacing, the ratio of the pressure of the reactive gas to that of the inner gas (carrier gas) as well as the electrical data all having a decisive role to play. Guides for carrying out the optimization procedures have been indicated above.

The following effect is explained by reference to FIG. 6: with the paired cathode arrangement, the ion bombardment of the substrate and thus the attainable increase in temperature and the self-cleaning effect are considerably enhanced. With a 3:1 ratio of target area to substrate area, it becomes possible, when using a cathode having a target area of 430 $cm^2$ and with a substrate biasing potential of 250 volts, to "draw" approximately 2 amperes, i.e. 500 watts of substrate load from the plasma, if the cathode loading is 4.6 kW. Thus, the attainable substrate area loads of approximately 3.6 $W/cm^2$ are comparable with those occurring in ion cladding.

EXAMPLE

In apparatus as described hereinafter by reference to FIGS. 10 and 11, the following tests were carried out: the paired targets were made of titanium for the purpose of forming titanium nitride coatings. The spacing of the target surfaces was 120 mm; the atomization pressure lay within a range of from 5 to $10\times10^{-3}$ mbars. At a target loading of approximately 11 $W/cm^2$, the rate of deposit by atomization of the titanium nitride that was formed was approximately 27 Å/s. The most important influencing factor was found to be the partial pressure of the nitrogen, which was varied over the range of the x-axis values shown in FIG. 7. This Figure also shows the hardness of the coating as a function of the nitrogen partial pressure. It will be seen that within a very narrow partial pressure range, which was between 6 and $7\times10^{-4}$ mbars under the stated conditions, condensation of very hard titanium nitride coatings took place. A value of approximately $H_{V10}=3000$ $kp/mm^2$ was determined for the hardness of 5 μm-thick TiN coatings on substrates of V2A steel. Under the stated conditions, the condensate consisted of mainly stoichiometric TiN in the zone of great hardness.

FIG. 8 shows an Auger-profile representation of the distribution of titanium, nitrogen, oxygen and iron as a function of the thickness of the coating. The concentration of the stated elements in atom percentages is plotted along the y-axis; the x-axis represents the thickness of coating in μm. Over the range of from 0.2 to 5 μm, the coating consists mainly of 43% Ti and 50% N. Also, an oxygen content of approximately 5% is found to be present over the entire depth. Oxygen enrichment, from which the presence of a thin oxide skin can be concluded, was observed to a depth of 0.2 μm at the surface of the coating. An increase in the oxygen content is also observed at the base of the coating. Here, the oxide coating on the substrate of V2A steel had obviously been reduced, and atomic oxygen had diffused towards the surface of the coating under the effect of heat. The sharp rise in the Fe signal enables the surface of the V2A steel to be detected; (the corresponding signals for Cr and Ni are not considered in the illustration). Finally, the relatively slow decline of the Ti signal over the range of from 5 μm to 6 μm points to diffusion of Ti into the surface of the V2A steel. This is obviously the reason for the excellent adherence of the TiN coatings deposited in this way by atomization.

FIG. 9 shows the effect of substrate temperature on the hardness of the coating. By means of different substrate biasing potentials, but also by suitably preheating the substrate, the shaped parts were raised to temperatures of between 50° and 600° C. In this temperature range the hardness $H_{V10}$ rose from approximately 1000 to 3750 $kp/mm^2$.

The cathodic atomization apparatus illustrated in FIG. 10 is used for the coating of shaped parts of smaller dimensions such as watch-cases, watch-straps, small drills, etc. The equipment operates on a batchwise basis and comprises a vacuum chamber 1 having a diameter of 700 mm. The vacuum chamber has a door 2, which opens forwardly, and a drum-shaped substrate holder 3 which is rotatable about a vertical axis and the outer surface of which is made up of separate parts 4. These parts contain rods 5, to which the shaped parts or substrates are secured. One of the parts forming the exterior of the holder is shown as being extracted along the broken lines so as to make it easier to see the interior of the apparatus.

Disposed at the periphery of the substrate holder 3 is a first cathode arrangement 6. In the operating position, a second cathode arrangement 7 is disposed opposite the first within the substrate holder 3; the second cathode arrangement is shown as being drawn forward in FIG. 10. The second cathode arrangement 7 is movable forwardly by means of a guide device 8 on the floor of the vacuum chamber 1. As soon as the second cathode arrangement is returned to a position in which it is disposed opposite the first cathode arrangement and in which the planes of symmetry of the two cathode arrangements lie in a radial plane of the substrate holder, the outer part 4 can be reinserted into the substrate holder. After the above-described operating conditions have been established, the apparatus is ready to operate. For supplying current, use is made of a switchgear cabinet 9 in conjunction with a high-frequency adaptor unit 10, only the casing of which is illustrated. The first cathode arrangement 6 may also be removed for the purpose of changing targets, for example, but this is done in the outward direction through a side wall of the vacuum chamber. The distance between the two cathodes is 120 mm.

FIG. 11 shows the first and second cathode arrangements 6 and 7 of FIG. 10 in section, i.e. in plan view. The path of movement 11 of the substrate holder 3 and of the shaped parts is indicated by the dash-dot line and lies between the cathode arrangements. The path of movement 11 is shown as being rectilinear but it is in fact slightly curved, depending upon the radius of the substrate holder 3 shown in FIG. 10. In the apparatus as shown in FIG. 12, the bath of movement is in fact rectilinear. The first cathode arrangement 6 has a first target 12, and the second cathode arrangement 7 has a second target 13. Neither, the magnetic field generators, contained in the cathode arrangements, nor the magnetic field lines passed by the generators through the targets 12 and 13 are illustrated, since this, taken on its own, forms part of the prior art. The individual target surfaces are designated by the reference numerals 12a and 13a. The target surfaces 12a and 13a between them form a gap 14 in which the glow discharge, which causes the atomization process, occurs. It should also be mentioned that the substrate holder 3 is insulated from earth, i.e. from the vacuum chamber 1, by insulated suspension means, and it is connected to a voltage source for producing a negative potential difference with respect to earth.

In apparatus as shown in FIGS. 10 and 11, approximately 350 to 500 cases for men's watches can be coated with gold-colored titanium nitride, having a thickness of 0.25 μm, in one operating cycle which lasts approximately 45 minutes. In contrast, the unit illustrated in FIG. 12 is an in line-production installation. It is loaded with articles to be treated through a lock chamber 15, which also contains heating means 16 for prior heat-treatment purposes. This installation is suitable for the coating of shaped parts having diameters of up to 200 mm. The shaped parts are first heated to temperatures of up to 500° C. in the lock chamber and gas is removed from them. The lock chamber 15 is followed by the atomization chamber 17 proper. The atomization chamber is followed by a further lock chamber 18 for discharging the products after they have been coated. To enable the apparatus to be operated on a timed basis, the lock chambers 15 and 18 as well as the atomization chamber 17 are connected to separate vacuum pumps. The suction pipes are arranged in the manner illustrated. The vacuum pumps used are rolling-motion piston pumps 19, rotary vane pumps 20 and turbomolecular pumps 21.

Equipping the FIG. 12 apparatus with separate pumps makes it possible to operate on a timed basis. While a batch of shaped parts, that are to be coated, are being preheated in the lock chamber 15, a coating operation is proceeding in parallel therewith in the atomization chamber 17, while an already coated batch is cooling in the lock chamber 18. The atomization chamber 17 is separated from the lock chambers by two valves.

Two first cathode arrangements 6 and two second cathode arrangements 7 are accommodated in the atomizating chamber 17. The distance between the pairs of cathodes 6 and the pairs 7 is adjustable in order to enable optimum condensation conditions to be established for a wide variety of shaped parts. The shaped parts are coated on an in-line basis. Depending upon the size of these shaped parts, a self-induced rotary movement of them is possible and, in some instances, may also be essential. It is also possible to impart a swinging movement to the shaped parts in the coating space so as to increase the uniformity of the coating further. The capacity of the apparatus shown in FIG. 12 depends upon the dimensions of the shaped parts, the closeness of their packing in the vacuum chamber and the coating parameters that can be used, optimization of the conditions on the basis of the details provided above always being possible.

We claim:

1. A method of coating a part by cathodic atomization of target material, the part having a three-dimensional surface to be coated, comprising:

providing two, facing cathodic atomization devices for receiving the part to be coated in a discharge space therebetween, each cathodic atomization device having a target of the same material delimiting the discharge space, a cathode arrangement for producing a plasma cloud of the target material in the discharge space, and magnetic means producing a magnetic field which closes on the target for concentrating the plasma cloud of the target material in a zone at the target surface delimiting the discharge space; and applying a voltage which is negative with respect to ground to the part to be coated in the discharge space sufficient to cause the plasma clouds of the target material from the cathodic atomization devices at least to touch each other at the part to be coated in the discharge space.

2. Apparatus of coating a part by cathodic atomization of target material, the part having a three-dimensional surface to be coated, comprising:

two, facing cathodic atomization devices for receiving the part to be coated in a discharge space therebetween, each cathodic atomization device having a target of the same material delimiting the discharge space, a cathode arrangement for producing a plasma cloud of the target material in the discharge space, and magnetic means producing a magnetic field which closes on the target for concentrating the plasma cloud of the target material in a zone at the target surface delimiting the discharge space; and means for applying a voltage which is negative with respect to ground to the part to be coated in the discharge space sufficient to cause the plasma clouds of the target material from the cathodic atomization devices at least to touch each other at the place in the discharge space where the part to be coated will be received.

3. A method of coating a part by cathodic atomization of target material, the part having a three-dimensional surface to be coated, comprising:

providing two, facing cathodic atomization devices for receiving the part to be coated in a discharge space therebetween, each cathodic atomization device having a target of the same material with a surface delimiting the discharge space, a cathode arrangement for producing a plasma cloud of the target material in the discharge space, and magnetic means producing a magnetic field which closes on the target for concentrating the plasma cloud of the target material in a zone at the target surface delimiting the discharge space; and applying a voltage which is negative with respect to the ground to the part to be coated in the discharge space sufficient to facilitate at least touching of the plasma clouds of the target material from the cathodic atomization devices at the part to be coated in the discharge space.

4. The method of claim 3, wherein providing the cathodic atomization devices comprises providing at least one thereof with operating parameters so selected that the plasma clouds of the two cathodic atomization devices would overlap at least partially even when no part has been received in the discharge space therebetween and wherein applying the voltage which is negative with respect to ground to the part comprises so applying at least 10 V.

5. The method of claim 3, wherein providing the cathodic atomization devices comprises providing the cathode arrangement of each thereof with a discharge voltage of from about 200 V to about 1000 V in a way for an atomization power of from about 5 to about 30 watts/cm$^2$ at the surface of the target, providing the target surfaces, delimiting the discharge space with a spacing of from about 80 mm to about 200 mm, providing the magnetic means with a magnetic field strength of from about 150 Oersteds to about 350 Oersteds, and wherein applying a voltage comprises applying from about $-50$ V to about $-500$ V to the part; and further comprising providing a pressure in the discharge space of from about $1\times10^{-3}$ mbars to about $5\times10^{-2}$ mbars and a temperature to the part of from about 150° C. to about 500° C., whereby the method is adapted for producing hard coatings, and particularly nitride coatings.

6. The method of claim 3, wherein providing the cathodic atomization devices comprises providing the cathode arrangement of each thereof with a discharge voltage of from about 200 V to about 1000 V in a way for an atomization power of from about 10 to about 15 watts/cm$^2$ at the surface of the target, providing the target surfaces delimiting the discharge space with a spacing of from about 100 mm to about 150 mm, providing the magnetic means with a magnetic field strength of from about 200 Oersteds to about 250 Oersteds, and wherein applying a voltage comprises applying from about $-50$ V to about $-500$ V to the part; and further comprising providing a pressure in the discharge space of from about $5\times10^{-3}$ mbars to about $2\times10^{-2}$ mbars and a temperature to the part of from about 250° C. to about 300° C., whereby the method is adapted for producing hard coatings, and particularly nitride coatings.

7. The method of claim 6, wherein providing the pressure in the discharge space comprises providing the same with an atomsphere of an inert gas and nitrogen having a partial pressure of from about $4\times10^{-4}$ mbars to about $8\times10^{-4}$ mbars.

8. The method of claim 7, wherein the inert gas is argon.

9. Apparatus of coating a part by cathodic atomization of target material, the part having a three-dimensional surface to be coated, comprising:

two, facing cathodic atomization devices for receiving the part to be coated in a discharge space therebetween, each cathodic atomization device having a target of the same material with a surface delimiting the discharge space, a cathode arrangement for producing a plasma cloud of the target material in the discharge space, and magnetic means producing a magnetic field which closes on the target for concentrating the plasma cloud of the target material in a zone at the target surface delimiting the discharge space; and means for applying a voltage which is negative with respect to ground to the part to be coated in the discharge space sufficient to facilitate at least touching of the plasma clouds of the target material from the cathodic atomization devices at the place in the discharge space where the part to be coated will be received.

10. The apparatus of claim 9, wherein the cathodic atomization devices comprises at least one thereof adapted and configured for operating parameters so selected that the plasma clouds of the two cathodic atomization devices would overlap at least partially even when no part has been received in the discharge space therebetween and wherein the means for applying the voltage which is negative with respect to ground to the part comprises means for so applying at least 10 V.

11. The apparatus of claim 9, wherein, in the cathodic atomization devices, the cathode arrangement of each thereof has a discharge voltage of from about 200 V to about 1000 V in a way for an atomization power of from about 5 to about 30 watts/cm$^2$ at the surface of the target, the target surfaces delimiting the discharge space have a spacing of from about 80 mm to about 200 mm, the magnetic means has a magnetic field strength of from about 150 Oersteds, to about 350 Oersteds, and wherein the means for applying a voltage applies from about $-50$ V to about $-500$ V to the part; and further comprising means for providing a pressure in the discharge space of from about $1\times10^{-3}$ mbars to about $5\times10^{-2}$ mbars and a temperature to the part of from about 150° C. to about 500° C., whereby the apparatus is adapted for producing hard coatings, and particularly nitride coatings.

12. The apparatus of claim 9, wherein the surfaces of the targets are curved in a manner to delimit the discharge space between the target surfaces as at least a sector of substantially cylindrical section.

13. The apparatus of claim 12, wherein the surfaces of both targets are curved and arranged to delimit an annular, substantially-cylindrical section sector to the discharge space therebetween, and further comprising a cylindrical holder for holding the part to be coated and at least one other part to be coated, the holder being rotatable through the annular substantially-cylindrical section sector of the discharge space delimited by the target surfaces, thereby substantially enclosing at least the target of one of the cathodic atomization devices, and having at least a portion which is removable to allow removal of the target substantially enclosed thereby.

* * * * *